United States Patent [19]
Vrba et al.

[11] Patent Number: 5,657,756
[45] Date of Patent: Aug. 19, 1997

[54] METHOD AND SYSTEMS FOR OBTAINING HIGHER ORDER GRADIOMETER MEASUREMENTS WITH LOWER ORDER GRADIOMETERS

[75] Inventors: Jiri Vrba, Port Coquitlam; Gordon James Haid, Pitt Meadows; Wai Meng Sixtus Lee; Brent Ronald Taylor, both of Coquitlam; Mark Alan Tillotson, Maple Ridge, all of Canada

[73] Assignee: CTF Systems Inc., Port Coquitlam, Canada

[21] Appl. No.: 476,290

[22] Filed: Jun. 7, 1995

[51] Int. Cl.$^6$ .................................................. A61B 5/05
[52] U.S. Cl. ........................................ 128/653.1; 324/244
[58] Field of Search .................... 128/653.1; 324/244, 324/247, 248

[56] References Cited

U.S. PATENT DOCUMENTS

| | | | |
|---|---|---|---|
| 4,591,787 | 5/1986 | Hoenig | 324/248 |
| 5,026,682 | 6/1991 | Clark et al. . | |
| 5,122,744 | 6/1992 | Koch . | |
| 5,152,288 | 10/1992 | Hoenig | 128/653.1 |
| 5,187,436 | 2/1993 | Mallick . | |
| 5,311,129 | 5/1994 | Ludwig et al. . | |
| 5,437,276 | 8/1995 | Takada | 128/653.1 |
| 5,469,056 | 11/1995 | Zschner et al. | 324/247 |
| 5,471,985 | 12/1995 | Warden . | |
| 5,495,849 | 3/1996 | Hayashi et al. | 128/653.1 |

FOREIGN PATENT DOCUMENTS

| | | | |
|---|---|---|---|
| 0560621 | 9/1993 | European Pat. Off. | 324/248 |
| 0 645 118 | 3/1995 | European Pat. Off. . | |
| 2 258 314 | 2/1993 | United Kingdom . | |
| WO94/12100 | 6/1994 | WIPO . | |

OTHER PUBLICATIONS

International Search Report, International Application No. PCT/CA 96/00393, International Filing Date Jun. 7, 1996.
Superconductor Science and Technology, vol. 9, No. 4A, Apr. 1, 1996, pp. A112–A115.

Vrba, J. et al., "Noise Cancellation by a Whole–Cortex SQUID MEG System", IEEE Transactions on Applied Superconductivity, vol. 5, No. 2, pp. 2118–2123 (Jun. 1995).
Cheyne, D. et al., "Characteristisation of Human Sensorimotor Cortex Using Whole–Cortex MEG: Implications for Clinical Use", Presented at the 2nd Annual Meeting of the North American Biomagnetism Action Group, Detroit, Michigan (Apr. 1994).
Vrba, J. et al., "Whole Cortex MEG Systems", Presented at NABMAG 94, Detroit, Michigan (Apr. 1994).
Vrba, J. et al., "Whole Cortex 64 Channel System for Shielded and Unshielded Environments", Publication and Date Unknown.
Cheyne, D. et al., "Source Models of Slow Magnetic Fields Accompanying Movement: Whole–Cortex Measurements using Software Gradiometers", Presented at the 9th International Conference on Biomagnetism, Vienna (Aug. 1993).
Vrba, J. et al., "Whole Cortex, 64 Channel Squid Biomagnetometer System", IEEE Transactions on Applied Superconductivity, vol. 3, No. 1, pp. 1878–1882, (Mar. 1993).
McKay, J., et al., "Implementation of a Multi–Channel Biomagnetic Measurement System Using DSP Technology", Publication and Date Unknown.
Cheyne, D. et al., "Use of an Unshielded, 64–Channel Whole–Cortex MEG System in the Study of Normal and Pathological Brain Function", Presented at the 14th Annual International Conference of the IEEE Engineering in Medicine and Biology Society, Lyon, France (Nov. 1992).

(List continued on next page.)

*Primary Examiner*—William E. Kamm
*Assistant Examiner*—George R. Evanisko
*Attorney, Agent, or Firm*—Leydig, Voit & Mayer, Ltd.

[57] ABSTRACT

A method and system of obtaining magnetic measurements with a preselected order of sensor gradiometer which are substantially equivalent to those which would be obtained with a sensor gradiometer of a higher order. The system and method employs a reference system comprising reference tensor gradiometers and appropriate components of a measured tensor are combined with the measurements obtained from the sensor gradiometer to obtain a magnetic measurement substantially equivalent to that which would have been measured by a higher order sensor gradiometer.

22 Claims, 11 Drawing Sheets

OTHER PUBLICATIONS

Vrba, J. et al., "Biomagnetometers for unshielded and well shielded environments", Institute of Physical Sciences in Medicine, vol. 12, Supp. B, pp. 81–86 (1991).

Vrba, J. et al., "Whole Head Squid Magnetometer for Unshielded and Well Shielded Environments", Publication and Date Uknown.

Vrba, J. et al., "An Integrated Biomagnetic Robotic System", Adapted from Biomagnetism: Applications and Theory, Pergamon Press (1985).

Vrba, J. et al., "Noise Cancellation in Biomagnetometers", Advances in Biomagnetism, pp. 733–736 (Date Uknown).

Vrba, J. et al., "First–Gradient Balancing of Higher–Order Gradiometers", Presented at the IV International Workshop on Biomagnetism, Rome, Italy (Sep. 1982).

Vrba, J. et al. "Spatial discrimination in SQUID gradiometers and 3rd order gradiometer performance", National Research Council of Canada, pp. 1060–1073 (Dec. 1981).

Vrba, J. et al., "Digital Squid Electronics in Geophysical Applications", Workshop held at The Los Alamos Scientific Laboratory, Los Alamos, New Mexico (Jun. 1980).

Vrba, J., "SQUID Magnetometry", Research in part supported by the Dept. of E.M.R. et al., (Date Uknown).

Becker, W. et al., "First experiences with a multichannel software gradiometer recoding normal and tangential components of MEG", Physiol. Meas. 14, pp. A45–A50 (1993).

MAGNETOMETERS
EXAMPLE:     SYMBOL: 
$S^{(0)}$
1st ORDER GRADIOMETERS
EXAMPLES: 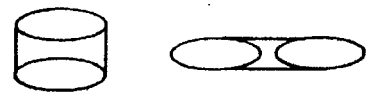    SYMBOL: 
$S^{(1)}$
2nd ORDER GRADIOMETERS
EXAMPLES: 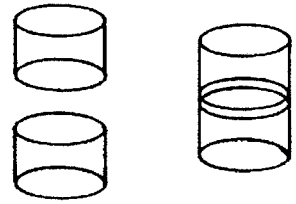    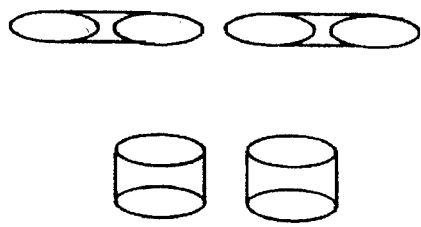
SYMBOL:   $S^{(2)}$
FIG. 1

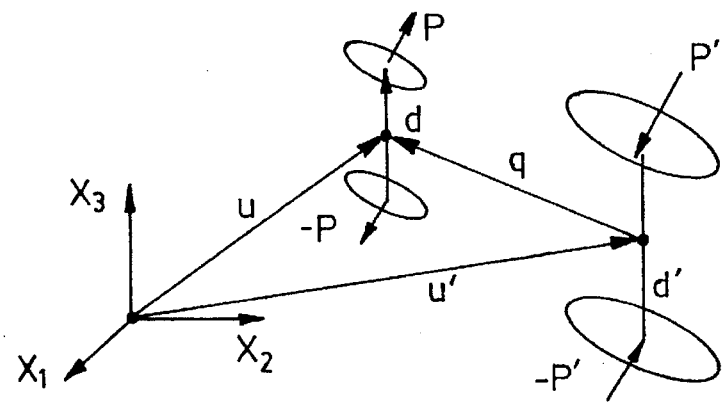
FIG. 5
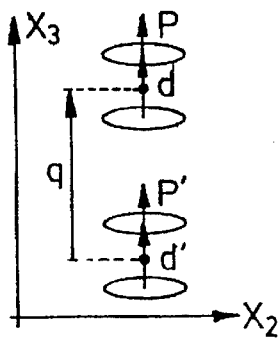
FIG. 6a
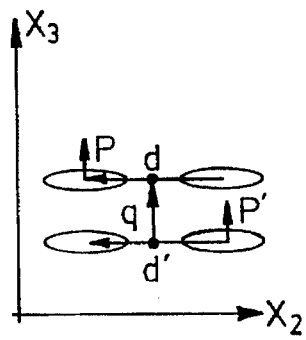
FIG. 6b
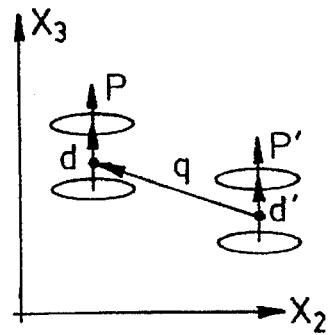
FIG. 6c
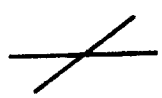
$b_i$, $i = 1,2,3$
FIG. 7a
$g_{ij}$, $i = 1,2,3$
$j = 1,2,3$
FIG. 7b
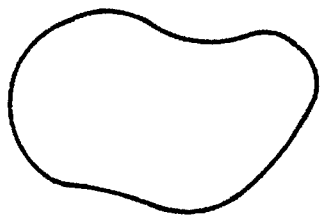
$g_{ijk}$, $i = 1,2,3$
$j = 1,2,3$
$k = 1,2,3$
FIG. 7c

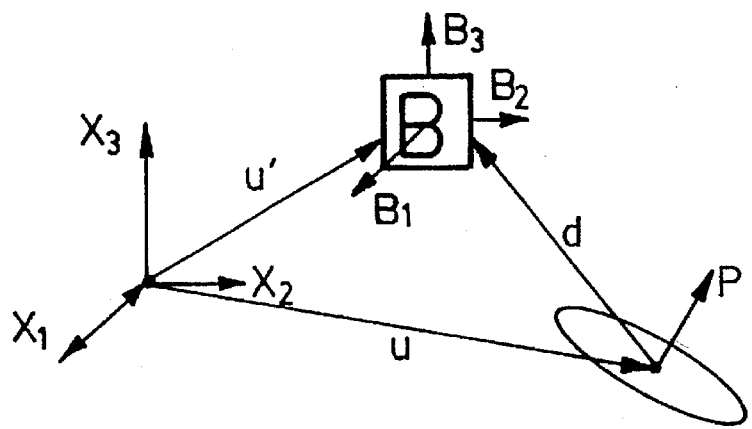
FIG. 8
(PRIOR ART)
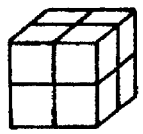    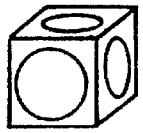        
FIG. 9a     FIG. 9b     FIG. 9c     FIG. 9d
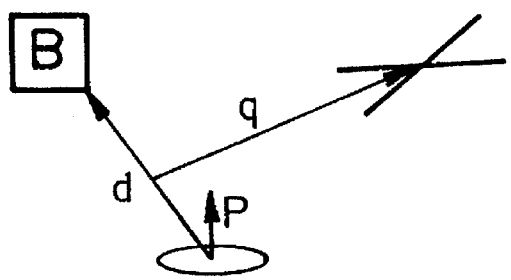
FIG. 10

METHOD AND SYSTEMS FOR OBTAINING HIGHER ORDER GRADIOMETER MEASUREMENTS WITH LOWER ORDER GRADIOMETERS

TECHNICAL FIELD

The present invention relates to systems and methods for obtaining magnetic measurements. More specifically, the present invention relates to magnetic measurements made with lower order gradiometers wherein measurements are eventually obtained which are substantially the same as measurements which would be obtained with gradiometers of a higher order.

BACKGROUND ART

Measurement of small signal magnetic fields with SQUID-based magnetometers is known. As used herein, the term small signal magnetic fields is intended to comprise magnetic field strengths such as those encountered in biomagnetometry, geophysics, SQUID-based non-destructive evaluation (SQUID NDE), etc.

It is also known to form gradiometers by either combining a pair of several pairs of magnetometers, as shown in U.S. Pat. No. 5,122,744 to Koch, or to form gradiometers which employ a pair, or pairs, of sensor coils of opposite sense as shown in U.S. Pat. No. 5,311,129 to Ludwig et al. A discussion of counter-wound gradiometers is presented in "Spatial Discrimination in SQUID Gradiometers and 3rd Order of Gradiometer Performance", J. Vrba, A. A. Fife and M. B. Burbank, Canadian Journal of Physics, 60, 1982, pp. 1060–1073, the contents of which are incorporated herein by reference.

Generally, as discussed in the above-mentioned Vrba et al. reference, gradiometers are preferred over magnetometers (as used herein, the terms magnetometer and zero order gradiometer are intended to be synonymous and references to gradiometers may also encompass magnetometers, depending upon the context of the reference, as will be apparent to those of skill in the art) as they provide improved spatial filtering of magnetic fields. In other words, non-zero order gradiometers can maintain high sensitivity to magnetic sources located relatively close to the gradiometer sensor coils and a sharply decreased sensitivity (improved rejection) to magnetic sources spaced relatively distant from the gradiometer sensor coils. Further, generally a higher order gradiometer will exhibit better rejection than a gradiometer of a lower order. Such spatial filtering is often advantageous and is particularly advantageous if the gradiometer is to be used in an unshielded or minimally shielded environment.

Due to various factors, such as physical and size constraints, manufacturability considerations and gradiometer balancing concerns, it is not generally practical to construct multi sensor systems which employ hardware second or higher order gradiometers sa sensors. Accordingly, multi sensor systems with hardware higher order gradiometer sensors have heretofore been commercially impractical.

It is desired therefore to have a method or system which provides measurements substantially equivalent to those which would be obtained with second order or higher gradiometers sensors without requiring the use of such sensors.

DISCLOSURE OF THE INVENTION

It is an object of the present invention to provide a novel method and system to employ sensor gradiometers of a given order to obtain magnetic measurements which are substantially the same as the measurements that would be obtained from sensor gradiometers of a selected higher order.

According to a first aspect of the present invention, there is provided a method of obtaining a magnetic measurement substantially equivalent to that which would be obtained from a gradiometer of a selected order equal to second order or greater which is higher than a given order of a sensor gradiometer, comprising the steps of:

(i) locating said sensor gradiometer at a first position;

(ii) locating a reference system spaced from said first position, said reference system comprising at least tensor gradiometers of the given order and each higher order up to one order less than said selected order;

(iii) determining said tensor of each said order of said reference system;

(iv) determining the characteristic vectors of said sensor gradiometer relative to said reference system;

(v) measuring the output from said sensor gradiometer;

(vi) projecting each said measured tensor of said reference system to said characteristic vectors of said sensor gradiometer and combining the result of said projection with said measured output to form a measurement substantially equivalent to that which would be obtained from a sensor of said selected order.

According to another aspect of the present invention, there is provided a system for obtaining magnetic measurements substantially equivalent to that which would be obtained from a gradiometer of a selected order equal to second order or greater which is higher than a given order of a sensor gradiometer, comprising:

(i) at least one sensor gradiometer of a given order;

(ii) a reference system spaced from said at least one sensor gradiometer, said reference system comprising at least tensor gradiometers of the given order and each higher order up to one order less than said selected order;

(iii) signal processing means to project outputs from each said tensor gradiometer of said reference system to said at least one sensor gradiometer and to combine the result of said projection with said measured output to form a measurement substantially equivalent to that which would be obtained from a sensor of said selected order.

According to another aspect of the invention, there is provided a biomagnetometer system for obtaining biomagnetic measurements substantially equivalent to those which would be obtained from gradiometers of a selected order equal to second order or greater, said selected order being higher than the given order of the sensor gradiometers employed, comprising: a plurality of sensor gradiometers of a given order; a reference system spaced from said plurality of sensor gradiometers comprising at least tensor gradiometers of the given order and each higher order up to one order less than said selected order; means to digitize measurement signals obtained from said plurality of sensor gradiometers and from said tensor gradiometers; processing means to project said digitized measurement signals from said tensor gradiometers to each of said plurality of sensor gradiometers and to combine each result of said projection with said digitized measurement obtained from each respective sensor gradiometer to form measurements substantially equivalent to that which would be obtained from sensor gradiometers of said selected order.

According to yet another aspect of the present invention, there is provided a method of obtaining magnetic measurements with at least one sensor gradiometer of a given order, said measurements being substantially equivalent to magnetic measurements which would be obtained with a like number of gradiometers of a selected higher order equal to second order or higher, comprising the steps of:

(i) locating a reference system at a first location, said reference system measuring the tensors of an order equal to said given order and of each order, if any, greater than said given order and less than said selected order;

(ii) locating said at least one sensor gradiometer at a respective second location and determining characterizing vectors for said at least one sensor gradiometer;

(iii) obtaining an output representing a magnetic measurement from said at least one sensor gradiometer;

(iv) projecting said determined tensors to said second characteristic vectors of said at least one sensor gradiometer at said location and combining the result of said projection with said obtained output to form a magnetic measurement substantially equivalent to that which would have been determined with a like number of sensor gradiometers of said selected order.

BRIEF DESCRIPTION OF THE DRAWINGS

Preferred embodiments of the present invention will now be described, by way of example only, with reference to the attached Figures, wherein:

FIG. 1 shows the symbols used herein to represent magnetometer (zero order gradiometer) sensors, first order gradiometer sensors and second order gradiometer sensors and example configurations of each order of sensor;

FIG. 5 is a schematic representation of a generalized second order gradiometer;

FIGS. 6a through 6c are schematic representations of some configurations of second order gradiometers;

FIG. 7a shows the symbol used herein to represent a three component vector (tensor) magnetometer;

FIG. 7b shows the symbol used herein to represent a first order tensor gradiometer;

FIG. 7c shows the symbol used herein to represent a second order tensor gradiometer;

FIG. 8 shows a prior art system used to obtain a magnetic measurement from a magnetometer which is substantially equivalent to that which would be obtained from a first order gradiometer;

FIGS. 9a through 9d show some of the possible configurations of tensor magnetometers;

FIG. 10 shows an embodiment of the present invention used to obtain a magnetic measurement from a magnetometer which is substantially equivalent to that which would be obtained from a second order gradiometer;

BEST MODE FOR CARRYING OUT THE INVENTION

In the following discussion, capital letters are used to refer to actual fields and gradients (i.e.—B, G) and lower case letters are used to refer to the outputs from various devices such as magnetometers, (i.e.—b). Also, bold typeface indicates a vector quantity and non-bold type face indicates a magnitude of respective vector. A preceding superscript indicates a relevant location (i.e.—$^O G$ indicates a gradient tensor at an origin (O) and a following superscript in brackets indicates the order of the quantity (i.e.—$G^{(1)}$ indicates a first order gradient tensor of a field and $g^{(1)}$ indicates measured first order gradiometer outputs corresponding to all components of the tensor $G^{(1)}$. In the following discussion, the order superscript may be omitted for 1st gradient tensors and/or gradiometer outputs, i.e. $G = G^{(1)}$ and $g = g^{(1)}$). Further, the subscript following a symbol indicates the component of a given quantity. For example, $G^{(1)}_{13}$ indicates the component 1,3 of the first gradient tensor and $g^{(1)}_{13}$ the measured component 1,3 of the first gradient tensor.

Equation 1 in Table A demonstrates that the magnetic field B at a position u relative to the origin O is given by a Taylor series expansion, that is the magnetic field at the origin ($^O B$) plus the first order gradient at the origin ($^O G^{(1)}$) projected to u plus one half the second order gradient ($^O G^{(2)}$) at the origin projected to u, etc. For clarity and simplicity, in the following discussion the higher order gradient terms are not shown. While this is not always the case, it has been found empirically that the influence of higher gradients can often be ignored.

Equations 2 through 4 in Table A give the first two terms of the Taylor series expansion of first, second and third order gradients at an arbitrary location. Of course, as will be apparent to those of skill in the art, the equations for fourth or higher order gradients are similar.

In the present invention, the sensor gradiometers can be of any order, but in practice, zero, first or second order gradiometers are preferred for reasons of size constraints and manufacturing concerns. If the sensor system is to be employed in a relatively noiseless environment, such as a room which is magnetically shielded, zero, first or second order sensor gradiometers may be employed. If the sensor system is to be employed in a moderately noisy environment, zero order gradiometers may not be suitable.

FIG. 1 shows the symbols employed herein for zero order, first order and second order gradiometer sensors, the symbols used to represent their outputs ($s^{(0)}$, $s^{(1)}$ and $s^{(2)}$ respectively) and examples of some of the possible configurations of those sensors. The present invention is not limited to the use of sensors of any particular configuration and radial, planar or other sensor configurations may be employed as desired.

Figure 2:
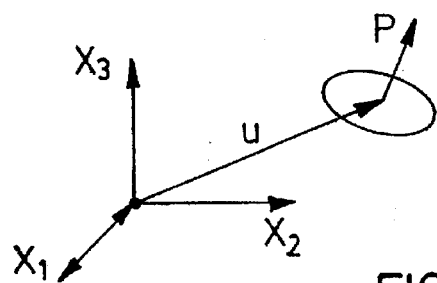
FIG. 2 is schematic representation of a zero order gradiometer sensor.

FIG. 2 shows a schematic representation of a zero order gradiometer sensor. The sensor is located at a position u relative to an origin and comprises a single coil of N turns. The sensor is defined by the characteristic unit vector p which is perpendicular to the coil area. Simply put, if the magnetic field is B, then the output $s^{(0)}$ of the sensor is the component of B perpendicular to the plane of the sensor coil (the dot product of B with p) times the gain of the sensor and is given by equation 5 in Table A where $\alpha_B$ is the gain of the sensor. In other words, the sensor output is given by the projection of the magnetic field vector into the direction of the sensor coil vector p.

Figure 3:
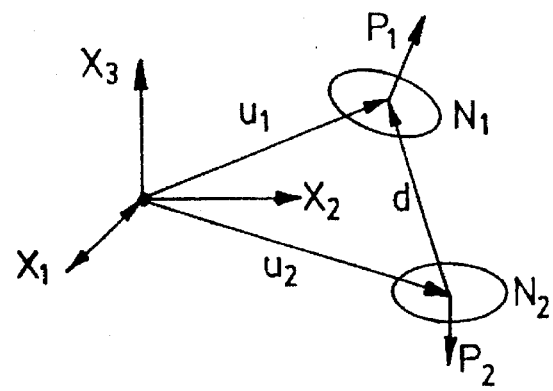
FIG. 3 is a schematic representation of a first order gradiometer sensor.

FIG. 3 shows a schematic representation of a first order gradiometer sensor comprising two sensor coils, represented by characteristic unit coil vectors $p_1$ and $p_2$ which are substantially in opposite directions ($p=p_1=-p_2$) and have a number of turns $N_1$ and $N_2$ respectively. Each sensor coil is located at a position represented by position vectors $u_1$, $u_2$ respectively and the two coils are separated by a gradiometer baseline represented by characteristic baseline vector d. The output of the sensor $s^{(1)}$ is given by the difference between the measurements from the two sensors, as shown in equation 6 in Table A, where $\alpha_G$ is the gain of the sensor. If the origin is shifted to the midpoint of d and setting $d=u_2-u_1$, equation 6 may be rewritten as shown in equation 7 in Table A. As is apparent, the output of the sensor is a projection of the first gradient tensor into the vectors p and d.

Figure 4A:
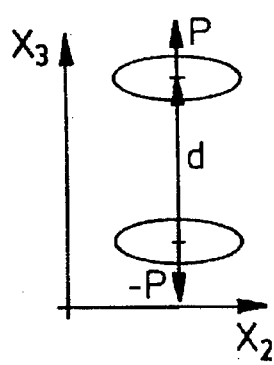
FIGS. 4a through 4c are schematic representations of first order gradiometers.
Figure 4B:
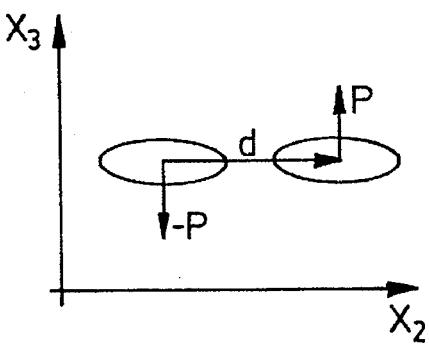
Figure 4C:
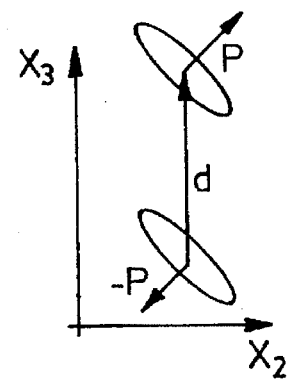

FIGS. 4a through 4c show three of the many other possible configurations for first order gradiometers. As will be apparent to those of skill in the art, for the gradiometer of FIG. 4a, given $d=d(0,0,1)$ and $p=(0,0,1)$, then the sensor output $s^{(1)}=\alpha_{G1}(p\cdot G\cdot d)=\alpha_{G1}G_{33}\cdot d$. For the gradiometer of FIG. 4b, given $d=d(0,1,0)$ and $p=(0,0,1)$, then the sensor output is given by $s^{(1)}=\alpha_{G1}(p\cdot G\cdot d)=\alpha_{G1}G_{23}\cdot d$. Also, for the gradiometer with tilted coils shown in FIG. 4c, given $d=d(0,0,1)$ and, for example, $p=(0,1/\sqrt{2},1/\sqrt{2})$, then the sensor output $s^{(1)}=\alpha_{G1}(p\cdot G\cdot d)=(\alpha_{G1}/\sqrt{2})(G_{23}+G_{33})\cdot d$. As shown, in this latter example, the sensor output is a mixture of first order gradient components.

FIG. 5 shows a schematic representation of a second order gradiometer. As shown in the Figure, a second order gradiometer generally comprises four coils which are usually arranged to form two first order gradiometers. Typically, the characteristic baselines d,d' are parallel and the characteristic coil unit vectors p,p' are opposite. In such cases, the output of each gradiometer is given by equation 7 and, assuming $d=d'$, the output $s^{(2)}$ of the second order gradiometer is given by equation 8 in Table A. From equation 2, setting $u=u-u'$ and using a similar derivation to that used for equation 7, the output of the second order gradiometer can be written as shown in equation 9 of Table A. As is apparent from equation 9, the output of the second order gradiometer is a projection of the second gradient tensor into the characteristic vectors p, q and d, where p is the coil orientation and q and d are the gradiometer baselines.

As with first order gradiometers, a variety of different configurations are possible for second order gradiometers and FIGS. 6a through 6c show three of the possible configurations. It will be apparent to those of skill in the art that for the configuration shown in FIG. 6a, wherein p, q and d are parallel and $p=(0,0,1)$, the sensor output is $s^{(2)}=\alpha_{G2}(p\cdot G^{(2)}\cdot q\cdot d)=\alpha_{G2}(G_{333}\cdot q\cdot d)$. For the configuration shown in FIG. 6b, wherein p and q are parallel and perpendicular to d, where $p=(0,0,1)$ and $d=d(0,1,0)$, the sensor output is $s^{(2)}=\alpha_{G2}(p\cdot G^{(2)}\cdot q\cdot d)=\alpha_{G2}(G_{233}\cdot q\cdot d)$. For configurations such as shown in FIG. 6c, for example wherein p is parallel to d, $p=(0,0,1)$ and $q=q(0,1/\sqrt{2},1/\sqrt{2})$, the sensor output is $s^{(2)}=\alpha_{G2}(p\cdot G^{(2)}\cdot q\cdot d)=(\alpha_{G2}/\sqrt{2})(G_{233}+G_{333})\cdot q\cdot d$. As shown, in this latter configuration the output is a mixture of second order gradient components.

While the discussion above have been limited to zero, first and second order sensors, it will be apparent to those of skill in the art that sensors of higher order may be employed if desired.

To obtain magnetic measurements which are substantially equivalent to those which would be obtained with higher order sensors, the present invention combines the measurements obtained from the sensors with measurements obtained from a reference system. Depending upon the order of measurements which are desired to be obtained, the reference system may include a tensor magnetometer, a first order tensor gradiometer and/or a second order tensor gradiometer and/or higher order tensor gradiometers. FIG. 7a shows the symbol used herein to represent a tensor magnetometer and the symbol used to represent its output, FIG. 7b shows the symbol used herein to represent a first gradient tensor and the symbol used to represent its output and FIG. 7c shows the symbol used herein to represent a second gradient tensor and the symbol used to represent its output.

As used herein, the term "tensor gradiometer" is intended to comprise a reference device which returns sufficient information to completely define the relevant measured characteristic, whether that be a zero order gradient (3 components of magnetic field), first order gradient (at least five linearly independent components), second order gradient (at last seven linearly independent components), etc.

First order gradient measurements from magnetometer sensor:

FIG. 8 shows a prior art system wherein a tensor magnetometer has been combined with a magnetometer sensor to obtain measurements substantially equivalent to measurements which would be obtained with a first order gradiometer. This system projects the relevant components of the magnetic measurements from the reference system to p and combines them with the sensor measurements to obtain a measurement which is substantially equivalent to that which would have been obtained from a first order gradiometer.

While the present invention can provide measurements such as those obtained with the prior art system of FIG. 8, the present invention has advantages in that it can also provide measurements substantially equivalent to those which would be obtained from second, third or hither order gradiometers. Further, the present invention is not particularly limited in that it may employ sensor gradiometers of zero, first, second or higher orders.

To provide these advantages and features, the present invention employs a novel reference system which may comprise tensor gradiometers of zero, first, second or higher orders. In the following discussions, it has been assumed that the outputs of the reference system tensor gradiometers are orthogonal. For those circumstances wherein these outputs are not orthogonal, it will be apparent to those of skill in the art the orthogonalization of the components should be performed as necessary.

FIG. 9a shows one possible reference tensor magnetometer configuration wherein three mutually orthogonal sensor coils are wrapped around a cubical carrier. FIG. 9b shows another possible configuration wherein the three mutually orthogonal sensor coils are placed on appropriate faces of a cubical carrier. FIG. 9c shows a configuration, such as that disclosed in U.S. Pat. No. 5,311,129 to Ludwig et al., wherein each of the three sensor coils are placed on a respective one of three faces of a pyramid-shaped carrier and are thus non-orthogonal to each other. FIG. 9d shows the general case wherein three sensor coils are distributed in space.

Presently, mutually orthogonal configurations are preferred for use in the reference system as the resulting measurements are less complex to process. However, it is contemplated that the additional signal processing required by non-orthogonal configurations may be offset by manufacturing advantages provided by constructing the reference system with planar coils in thin film configurations, such as those taught in Ludwig.

Whether the reference system of the present invention employs an orthogonal or a non-orthogonal configuration, it is important to note that it is not required that the sensor be aligned with any of the axes of the reference system.

Equation 10 in Table A shows how the first order gradiometer output $s^{(1)}$ of the prior art system of FIG. 8 is formed by projecting $b_i$, which are the three orthgonalized components of the magnetic field measured by the reference tensor magnetometer, to p and combining these values with the measured zero order sensor output $s^{(o)}$ after the gains of the sensor $\alpha_s$ and the reference system $\alpha_B$ have been normalized. In this equation, it has been assumed that the gain of each $b_i$ is the same, but the more general case can easily be accommodated.

Equation 10 can be rewritten in terms of a linear combination of reference system outputs, as shown in equation 11 in Table A, wherein the coefficients c are defined as $c_j=(\alpha_s/\alpha_B)p_j$ where $p_j$ are the components of p.

Second order gradient measurement from magnetometer sensor:

FIG. 10 shows a schematic representation of an embodiment of the present invention which is used to obtain a magnetic measurement from a magnetometer which is substantially equivalent to a measurement that would be obtained from a second order gradiometer. As is apparent, the system differs from that shown in FIG. 8 in that the reference system comprises a tensor zero order gradiometer and a tensor first order gradiometer.

Figure 11A:
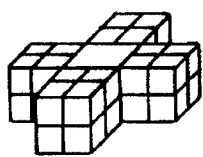
FIGS. 11a through 11d show some of the possible configurations of a first order tensor gradiometer.
Figure 11B:
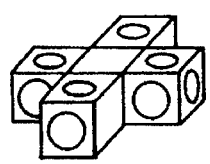
Figure 11C:
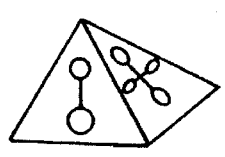
Figure 11D:
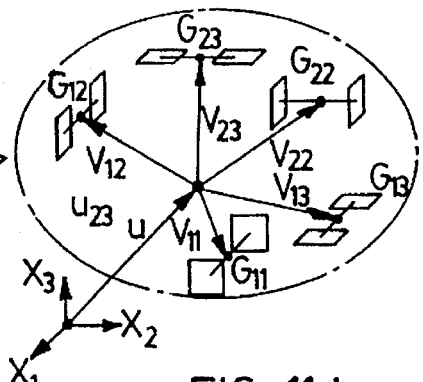

The reference system first order tensor gradiometer can be constructed in a variety of manners, a few possible configurations of which are shown in FIGS. 11a through 11d. FIG. 11a shows a first order tensor gradiometer configuration wherein the gradiometer coils are wrapped around appropriate portions of a cruciform-shaped carrier and this configuration, with circular coils, is presently preferred by the inventors. FIG. 11b shows another first order tensor gradiometer configuration wherein the gradiometer coils are placed on appropriate faces of a cruciform-shaped carrier. FIG. 11c shows a first order tensor gradiometer configuration as taught in the above-mentioned Ludwig patent FIG. 11d shows the general case of the tensor gradiometer coils distributed in space. Other configurations will also be apparent to those of skill in the art and may be preferred in some circumstances due to manufacturing or assembly concerns.

In the embodiment of FIG. 10, it is not required that the axis of the sensor correspond to any axis of the reference system. In fact, it is not required that the axes of the reference system tensor magnetometer correspond to the axes of the reference system first order tensor gradiometer. It should be noted however, that signal complexity and the associated signal processing requirements are reduced if the reference system tensor magnetometer and first order tensor gradiometer are aligned (for example having three common axes).

In this embodiment of the present invention, measurements obtained by the magnetometer (zero order gradiometer) sensor and measurements obtained by the reference tensor magnetometer are combined appropriately to obtain a first order gradiometer measurement which is then appropriately combined with measurements obtained by the reference system first order tensor gradiometer to obtain a measurement substantially equivalent to a measurement that would be obtained from a second order gradiometer sensor. Essentially, this procedure is the projection of reference tensor magnetometer and reference tensor first order gradiometer outputs into the characteristic vectors of the sensor and reference system (p,q,d).

Specifically, as shown in FIG. 10, the magnetometer (zero order gradiometer) sensor is characterized by vector p. The outputs of the reference tensor magnetometer are denoted by the vector d and the outputs of the reference first order tensor gradiometer are denoted by $g_{ij}$, where for example ij=(11, 12, 13, 22, 23, ...).

Accordingly, the second order gradiometer measurement is obtained from equation 12 in Table A, where $\alpha_s$ and $\alpha_B$ are defined as before, $\alpha_{G1}$ is the gain of the reference first order tensor gradiometer, d is the baseline of the equivalent first order gradiometer formed from the sensor magnetometer and the reference magnetometer outputs and $d_{G1}$ is the baseline of the reference first order tensor gradiometers which, in this example, is assumed to be equal for all components. In this particular example, for clarity and simplicity of description, it has been assumed that the gains of each component are the same in the tensor magnetometer and the first order tensor gradiometer and also that the baselines of the first order tensor gradiometer are the same. It will be apparent to those of skill in the art that this need not be the case and that equation 12 may easily be rewritten to accommodate variable gains or baselines.

In equation 12, g is the output of the reference tensor first order gradiometer, and this structure is substantially similar to the structure of the first order gradient tensor $G^{(1)}$. It will be apparent to those of skill in the art that a first order tensor gradient may be fully described with five linearly independent components. The tensor first order gradiometer output may be selected accordingly and one possible form thereof is shown in equation 13 of Table A. For convenience, these five components are referred to herein as the vector y, where for example $y=(g_{11}, g_{12}, g_{13}, g_{22}, g_{23})$. Accordingly, equation 12 may be rewritten to express the second order gradiometer output as a linear combination of the reference outputs as shown in equation 14 of Table A. In equation 14, the coefficients c are defined as before. The coefficients k are derived by gathering the terms associated with each of the terms $y_i$, i=1 to 5. Equations 15 through 19 in Table A show appropriate $k_i$ for the example of $y=(g_{11}, g_{12}, g_{13}, g_{22}, g_{23})$. In these equations, $\alpha_s$ is the gain of the sensor, $\alpha_{Gij}$ is the gain of the reference first gradient tensor component ij, $d_{ij}$ is the baseline length of the reference tensor first order gradiometer, $d=(d_1,d_2,d_3)$ is the baseline vector corresponding to the sensor and the length of this vector is d, and $p=(p_1, p_2, p_3)$ is the characteristic coil vector of the sensor. This is an example wherein $\alpha_G$'s and $d_{Gi}$'s are not all the same and, for brevity, $d_{Gi}$ has been replaced with $d_{ij}$.

Figure 12:
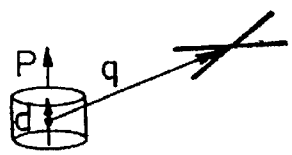
FIG. 12 shows an embodiment of the present invention used to obtain a magnetic measurement from a first order gradiometer which is substantially equivalent to that which would be obtained from a second order gradiometer.

Second order gradient measurement from first order gradiometer sensor:

FIG. 12 shows a schematic representation of an embodiment of the present invention which is used to obtain a magnetic measurement from a first order gradiometer which is substantially equivalent to a measurement that would be obtained from a second order gradiometer. As with the other embodiments, it is not necessary that the sensor gradiometer have an axis aligned with an axis of the reference first order tensor gradiometer.

In this embodiment, the output of the sensor, $s^{(1)}$, is given by equation 7 and the desired second gradient measurement $s^{(2)}$ is again obtained by projecting the reference first order gradient tensor into the characteristic vectors p and d, as in the third term of equation 12 and the result is combined with the sensor output $s^{(1)}$. As before, the second gradient $s^{(2)}$ may be expressed as a linear combination of the reference first order gradient tensor outputs as in equation 20 in Table A and wherein the coefficients k are those given in equations 15 through 19. It will be apparent that, in equations 15 through 19, provisions have been made for varied gains and/or baselines.

Figure 13:
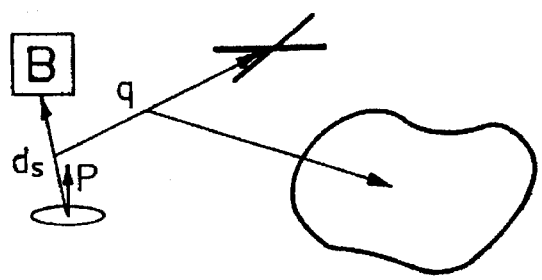
FIG. 13 shows an embodiment of the present invention used to obtain a magnetic measurement from a magnetometer which is substantially equivalent to that which would be obtained from a third order gradiometer.

Third order gradient measurement from magnetometer sensor:

FIG. 13 shows a schematic representation of an embodiment of the present invention which is used to obtain a magnetic measurement from a zero order gradiometer which is substantially equivalent to a measurement that would be obtained from a third order gradiometer. As is apparent, the system differs from that shown in FIG. 12 in the addition of a second order tensor gradiometer to the reference system.

The reference second order tensor gradiometer can be constructed in a variety of manners, some of which are shown in FIGS. 14a through 14g. Other configurations will also be apparent to those of skill in the art and maybe preferred in some circumstances due to the manufacturing or assembly concerns. It will be observed that the configurations of the reference system second order tensor gradiometers shown in FIGS. 14a and 14g include redundant components. These redundant components are included to provide fault tolerance to cope with a failure of a component in the reference system. The bars (non-cruciforms) in FIG. 14 represent incomplete tensor gradiometers with components as required by a particular configuration of the reference tensor gradiometer.

Figure 14A:
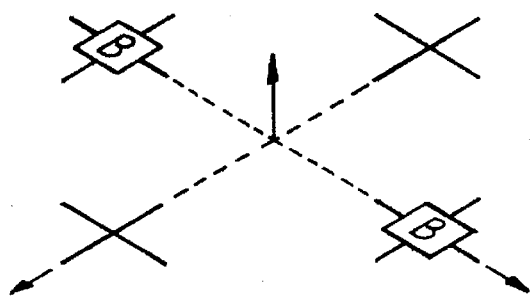
FIG. 14a shows a preferred configuration of a second order tensor gradiometer.
Figure 14B:
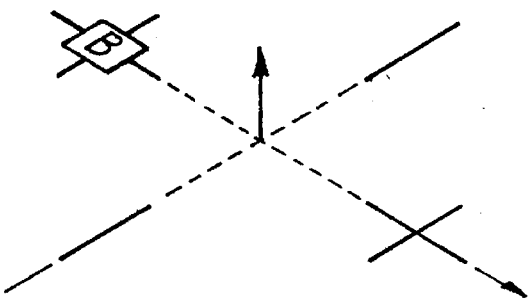
FIGS. 14b through 14g show other possible configurations of a second order tensor gradiometer.
Figure 14C:
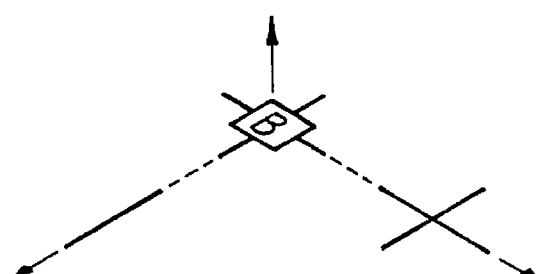
Figure 14D:
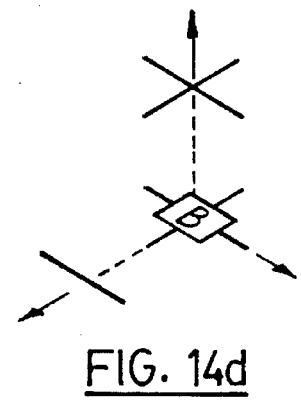
Figure 14E:
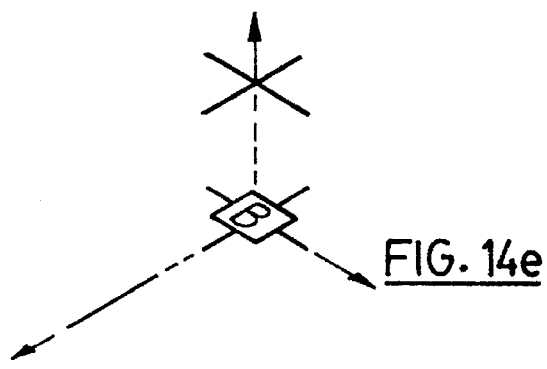
Figure 14F:
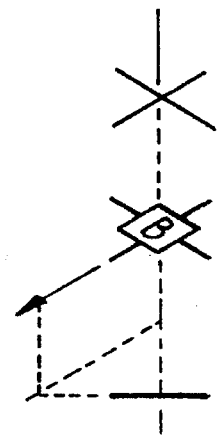
Figure 14G:
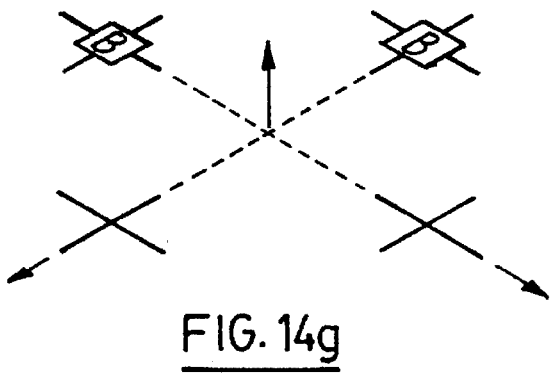
Figure 15:
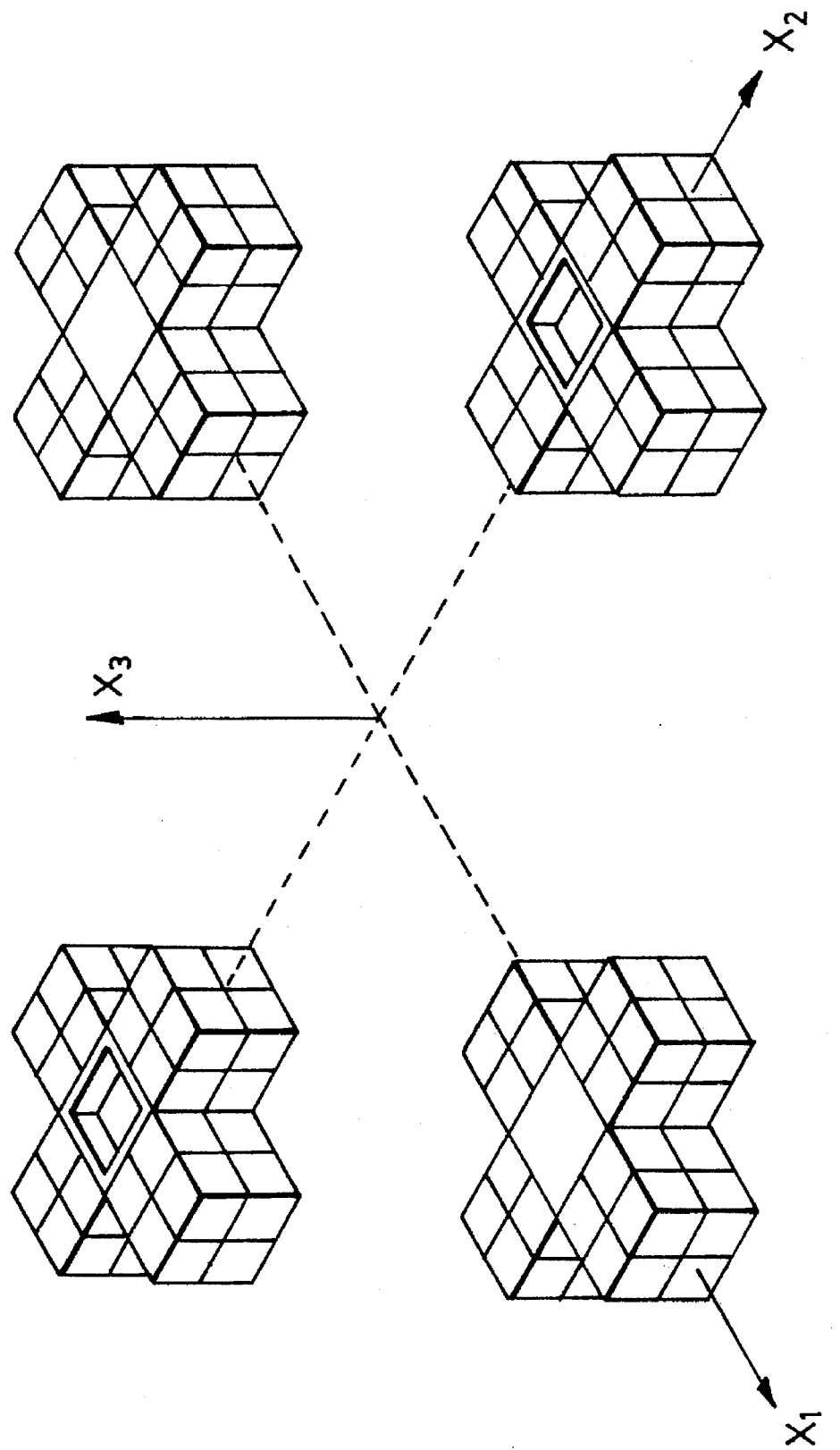
FIG. 15 shows the configuration of the second order tensor gradiometer of FIG. 14a in more detail.

FIG. 15 shows the example of FIG. 14a in more detail. It will be apparent to those of skill in the art that the required second order tensor gradient components, $G_{ijk}$, can be obtained from this particular configuration, for example, as follows:

$$G_{111}=Q_{11}-P_{11}$$

$$G_{112}=G_{11}-R_{11}$$

$$G_{113}=Q_{13}-P_{13}$$

$$G_{122}=G_{12}-R_{12}$$

$$G_{123}=G_{13}-R_{13}$$

$$G_{222}=G_{22}-R_{22}$$

$$G_{223}=G_{23}-R_{23}$$

The required first order tensor gradient components are obtained either from the direct measurements or are synthesized from strategically located zero order sensors and the zero order components are obtained from the tensor magnetometer included in this configuration.

As is clear from the above, as in the other embodiments of the present invention, it is not necessary that the sensor magnetometer (zero order gradiometer) be aligned with any component of the reference system, although this is preferred to reduce signal processing requirements.

As shown in FIG. 13, in this embodiment the sensor is a magnetometer specified by characteristic vector p and gain $\alpha_s$. In a manner similar to that used to derive equation 1, equation 21 in Table A may be derived for the third order gradient measurement. In this equation, where $\alpha_B$, $\alpha_{G1}$ and $\alpha_{G2}$ are the gains of the reference system tensor magnetometer, first order tensor gradiometer and second order tensor gradiometer respectively. Also, $g^{(1)}$ corresponds to the first order tensor gradiometer outputs, as in equation 13, and $g^{(2)}$ corresponds to the second order tensor gradiometer outputs. As will be apparent to those of skill in the art, a second order tensor gradient may be completely expressed with seven linearly independent terms and can be expressed, for example, as a vector r where $r=g^{(2)}=(g_{111}, g_{112}, g_{113}, g_{122}, g_{123}, g_{222}, g_{223})$. As before, the third gradient $s^{(3)}$ may be expressed as a linear combination of the reference second order gradient tensor outputs, reference first order gradient tensor outputs and reference tensor magnetometer outputs. The third order gradiometer output can then be formed from Equation 22 in Table A where all parameters are as described before.

In the most preferred embodiment of the present invention, the reference second order tensor gradiometer comprises a number of first order gradiometers which are organized in groups which measure first order gradient tensors. In this circumstance, the last term of equation 22 may be re-written as a simpler combination of these first order gradiometer terms.

There are a very large number of possible configurations for the reference second order tensor gradiometer. In the configuration of FIG. 15, which is presently preferred, the reference second order tensor gradiometer consists of two first order tensor gradiometers and two partially populated first order tensor gradiometers. If the outputs of these tensor gradiometers are denoted by v, x, y and z, it will be apparent to those of skill in the art that each of v and x has two linearly independent components while each of y and z have five linearly independent components.

Then, as with the coefficients $k_j$ described above and shown in equations 15 through 19, we can define suitable coefficients $M_j$, $D_j$, $N_j$ and $T_j$ to obtain equation 23 in Table A.

As will be apparent to those of skill in the art, other configurations of the reference system are possible. For example, the reference tensor magnetometer may be located either spaced from or at the same location as the first order tensor gradiometer. Also, the reference tensor magnetometer may be spaced from or at the same location as some elements of the reference second order tensor gradiometer. Similarly, the reference first order gradiometer may be spaced from or at the same location of some elements of the reference second order gradiometer. For example in the presently preferred embodiment shown in 15, the reference tensor magnetometer is located at element G which is the reference first order gradiometer. Also, element G forms one part of the reference second order gradiometer.

As will be apparent from the discussion above, the redundant elements allow the reference second order gradiometer and/or the reference first order gradiometer to be reconfigured (i.e.—constructed from a different selected set of elements) as required.

Figure 16:
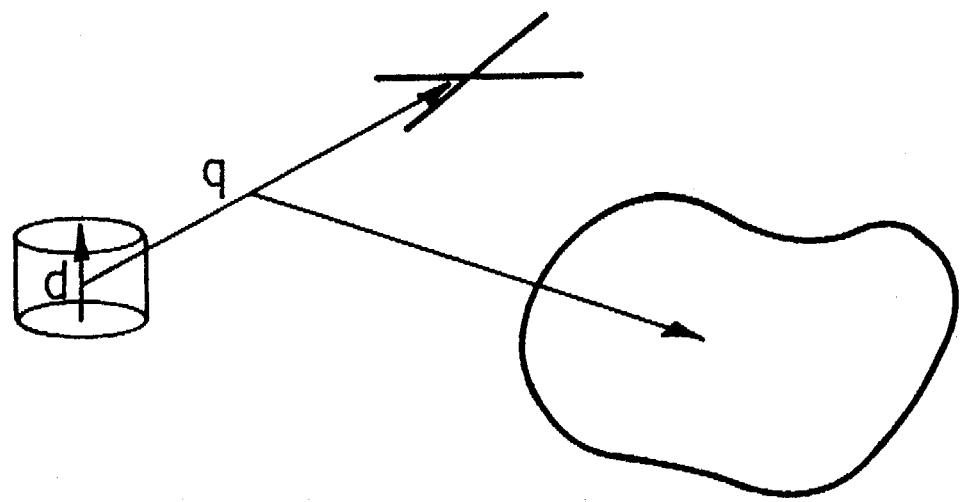
FIG. 16 shows an embodiment of the present invention used to obtain a magnetic measurement from a first order gradiometer which is substantially equivalent to that which would be obtained from a third order gradiometer.

Third order gradient measurement from first order sensor:

FIG. 16 shows a schematic representation of an embodiment of the present invention which is used to obtain a magnetic measurement from a first order gradiometer which is substantially equivalent to the measurement that would be obtained from a third order gradiometer. The third order gradiometer measurement may be obtained in a manner similar to equation 21, where the second term on the right hand side of the equal sign is omitted. As before, the third gradient measurement may be expressed as a linear combination of reference system outputs in a manner similar to equation 23 with the second term omitted, resulting in equation 24 in Table A wherein all of the parameters are defined as before. Again, it is not required that the sensor, the first order tensor gradiometer or the second order tensor gradiometer be aligned, nor be located at any particular location relative to each other.

Figure 17:
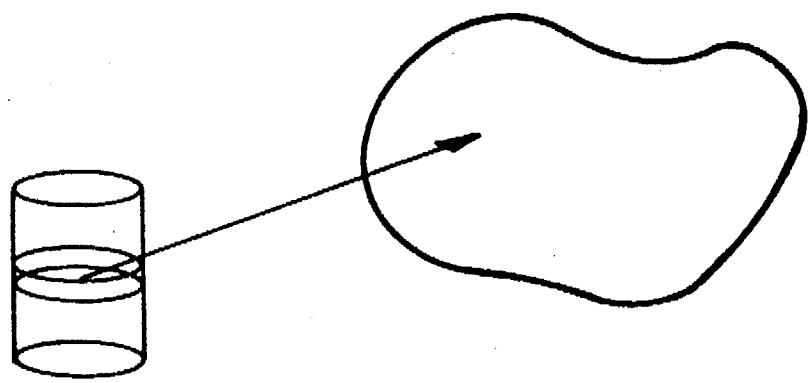
FIG. 17 shows an embodiment of the present invention used to obtain a magnetic measurement from a second order gradiometer which is substantially equivalent to that which would be obtained from a third order gradiometer.

Third order gradient measurement from second order sensor:

FIG. 17 shows a schematic representation of an embodiment of the present invention which is used to obtain a magnetic measurement from a second order gradiometer which is substantially equivalent to the measurement which would be obtained from a third order gradiometer. In this embodiment, the second order gradiometer sensor is specified by the characteristic vectors p, q and d. Thus, the third order gradiometer measurement is obtained in a similar manner to that discussed above and results in equation 25 in Table A wherein all of the parameters are defined as before. Again, it is not required that the sensor, the first order tensor gradiometer or the second order tensor gradiometer be aligned, nor be located at any particular location relative to each other.

It should be apparent to those of skill in the art that the above-described method and system may be extended, if desired, to provide magnetic measurements substantially equivalent to those which would be obtained from fourth or higher order gradiometers.

As will also be apparent to those of skill in the art from the discussion above, the present invention provides a method and system to obtain magnetic measurements with a sensor of a predefined order and to combine those measurements with measurements from a reference system to obtain measurements substantially equivalent to those which would be obtained from a sensor of a higher order. The reference system provides tensor information for each of the orders from the predefined sensor order to one order less than that of the desired order of the measurement. For example, for a system with magnetometer sensors wherein a third order measurement is desired, the reference system would include a tensor magnetometer, a first order tensor gradiometer and a second order tensor gradiometer. As another example, if first order gradiometer sensors are employed and a third order measurement is desired, the reference system need only include a first order tensor gradiometer and a second order tensor gradiometer, although for many systems it may be necessary to include a tensor magnetometer for other purposes.

In the discussion above, ideal devices and device characteristics have been assumed. While this is not an unrealistic assumption in many cases, gradiometers and magnetometers do suffer to some extent from imperfections and errors. While the effects of these errors can be large in some circumstances, they can be compensated for through the inclusion of correcting coefficients in the relevant equations above, as would occur to one of skill in the art.

Figure 18:
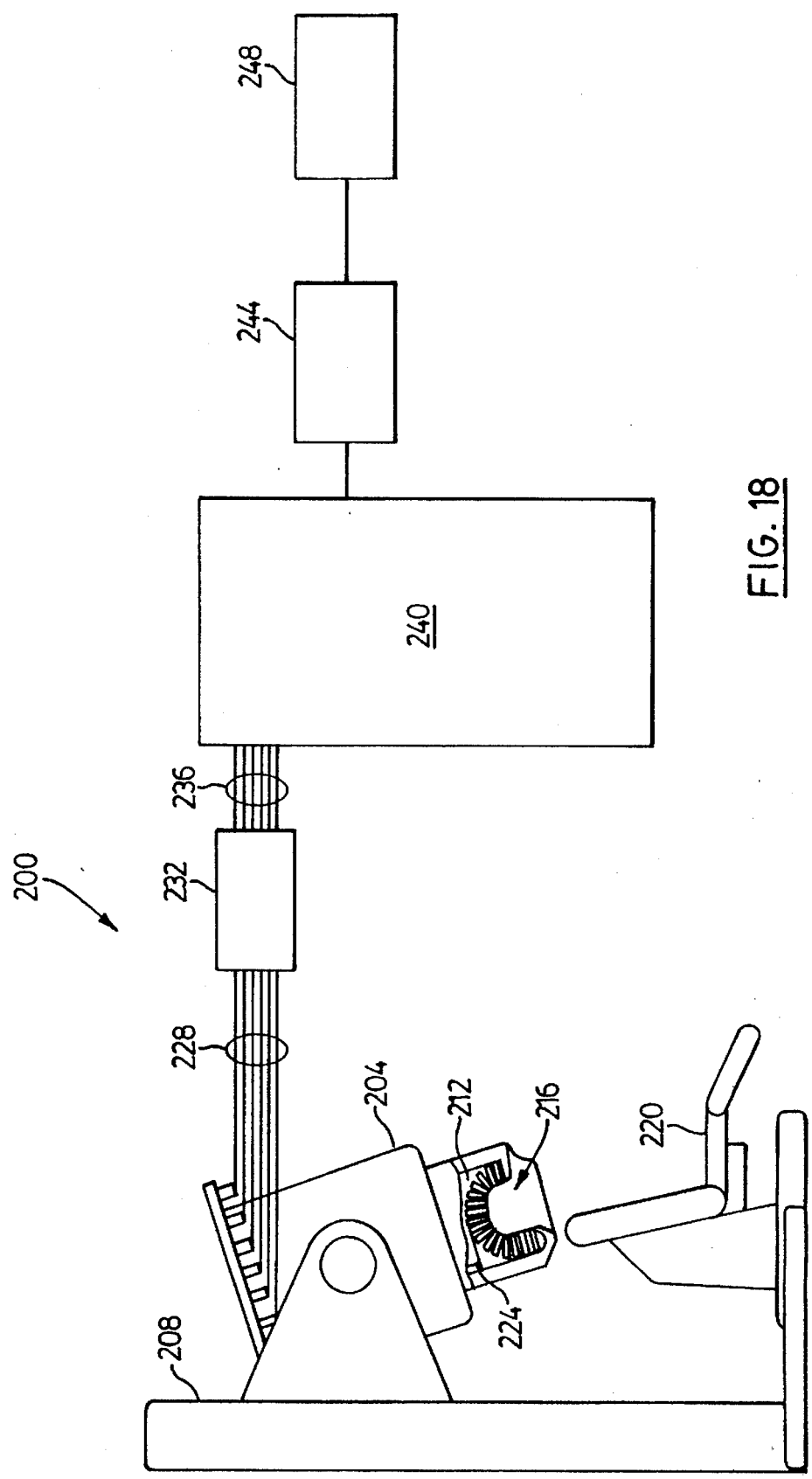
FIG. 18 shows a multi-channel biomagnetometer system which employs the present invention.

FIG. 18 shows an embodiment of the present invention comprising a 143 channel biomagnetometer system 200. System 200 comprises a dewar 204 which is supported by a gantry 208, the dewar having a head-shaped helmet 216 at is lower end, and a patient support 220 which supports a patient while the patient's head is inserted into helmet 216.

Dewar 204 includes an array 212 of gradiometer sensors about helmet 216 and a reference system 224 above helmet 216. The SQUIDs associated with array 212 of sensors and reference system 224 are located above reference system 224 within dewar 204 which is filled with a cryogen (for example liquid helium for low temperature superconductor or liquid nitrogen for high temperature superconductors) in operation. As the measurements obtained from both array of gradiometer sensors 212 and reference system 224 are susceptible to errors due to mechanical vibration, gantry 208 is designed to minimize vibrations and to have a relatively high characteristic frequency. Of course, as will be understood by those of skill in the art, gantry 208 will be designed with different characteristics for different biomagnetic sources, for example cardiac measurements. The design of such a gantry is not particularly limited and various techniques and design will occur to those of skill in the art.

The outputs 228 of the sensors and the reference system are amplified to a desired level by SQUID pre-amplifiers 232 and the resulting signals 236 are processed by System Electronics 240.

System Electronics 240 comprises a plurality of SQUID controllers and analog to digital (A/D) conversion means, to convert signals 236 to digital values, and a plurality of digital signal processors (DSPs) to perform desired processing of these digital values. In the presently preferred embodiment, Texas Instruments TMS320 DSP processors are employed to process these digital values. In the presently preferred embodiment, each DSP processes signals from up to eight sensors of array 212 of sensors and this provides sufficient processing speed to allow real time processing of these signals.

Once processed, the resulting signals are forwarded to an Acquisition computer 244 and a Processing computer 248 via a suitable communications link, such as a SCSI interface. In the presently preferred embodiment, Acquisition computer 244 and Processing computer 248 are different computer systems, but in some circumstances they may be combined in a single computer system.

Acquisition computer 244 and Processing computer 248 can be any suitable computer systems with graphical workstation capabilities such as, for example, a suitably equipped Unix-based workstation or a member of the Macintosh family of microcomputers manufactured by Apple. Acquisition computer 244 performs several tasks, including tuning of SQUIDs, data collection and storage and control of optional peripheral components, such as stimulus and EEG systems. Processing computer 248 performs off-line data processing of stored data and display of real time or stored data. As will be apparent to those of skill in the art, processing computer 248 may also combine data from the biomagnetometer with other data, such as MRI or CAT scans, to produce graphical displays which can be interpreted in a more intuitive manner.

Additionally, EEG or other data of interest may be collected simultaneously with the measurements made by array of sensors 212 and reference system 224 and, in the preferred embodiment, system electronics 240 includes 64 channels to which such inputs may be applied.

In the embodiment of FIG. 18, the array 212 of sensors is composed of first order gradiometer sensors. One of the advantages of the present invention is that by combining the reference system with a plurality of sensors, the effective order of those sensors can be increased to a second, third or higher order (provided that the reference system includes a tensor gradiometer for each order from the sensor order to one order less than the desired measurement order) merely by appropriately combining and processing the sensor and reference system signals. In fact, if desired, the effective order of the measured signals may be changed as desired to observe differences in the signals. This change may be accomplished "on the fly" to signals being processed in real time or may be applied off-line to signals previously obtained and stored.

Another advantage of the present invention is that systems such as the one shown in FIG. 18, may employ first order gradiometer sensors when installed in a moderately magnetically shielded room and, by processing the signals as disclosed herein, obtain results which would otherwise require a heavily magnetically shielded room. Thus, the costs associated with the shielding of a site for such systems is reduced. If the system is used in an environment subject to less magnetic noise, such as a heavily shielded room, the system may employ magnetometer sensors, if desired.

Figure 19:
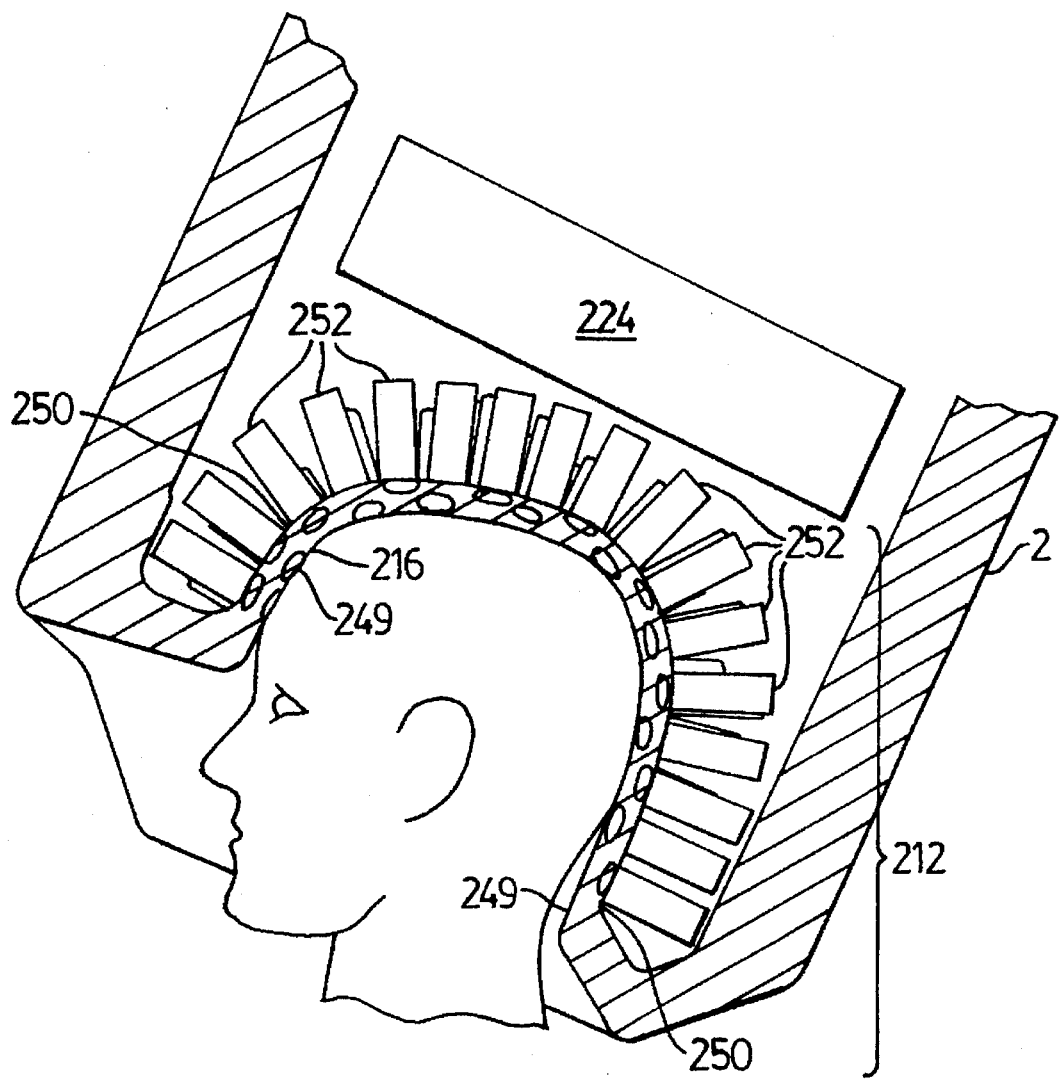
FIG. 19 shows a cross section of a configuration of a helmet, array of sensors and reference system used in the biomagnetometer system of FIG. 18.

FIG. 19 shows helmet 216, array 212 of sensors, reference system 224 and a portion of dewar 204 in more detail. As shown, helmet 216 is formed of two spaced and generally parallel walls 249,250 which define a vacuum space therebetween. Each of sensor gradiometers 252, which make up array 212 of sensors, is mounted to wall 250 of helmet 216 and wall 249 is shaped to receive a human head. Helmet 216 is shaped such that each sensor 252 is located in close proximity to the surface of the human head received therein. In an attempt to ensure a good fit of helmet 216 to a variety of human heads, it has been found that different helmets can be constructed, along anthropometric lines, for biomagnetometer systems intended for use with different races.

Figure 20:
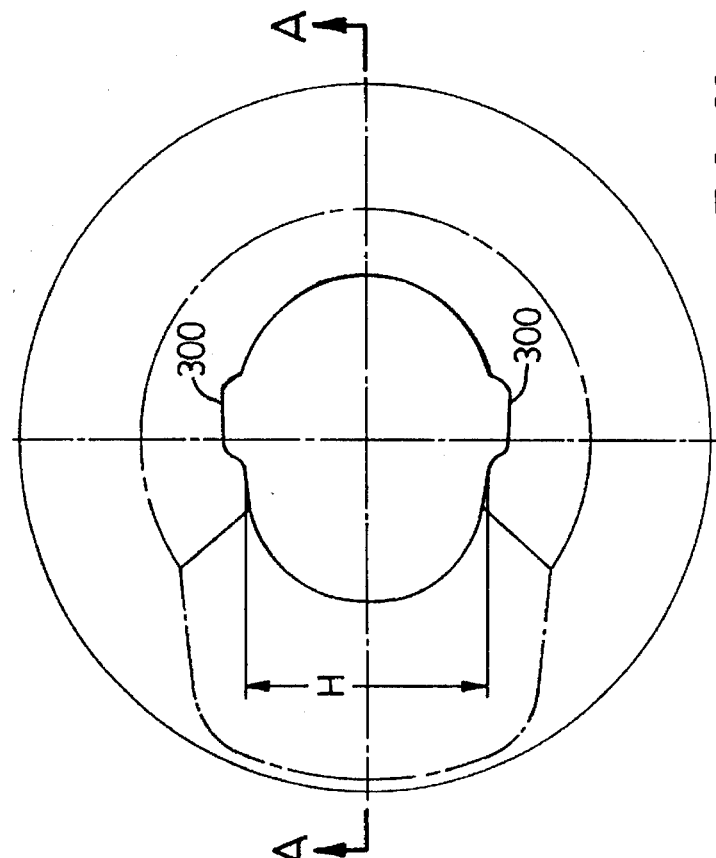
FIG. 20 shows a top view of a section of a helmet in accordance with one aspect of the present invention.
Figure 21:
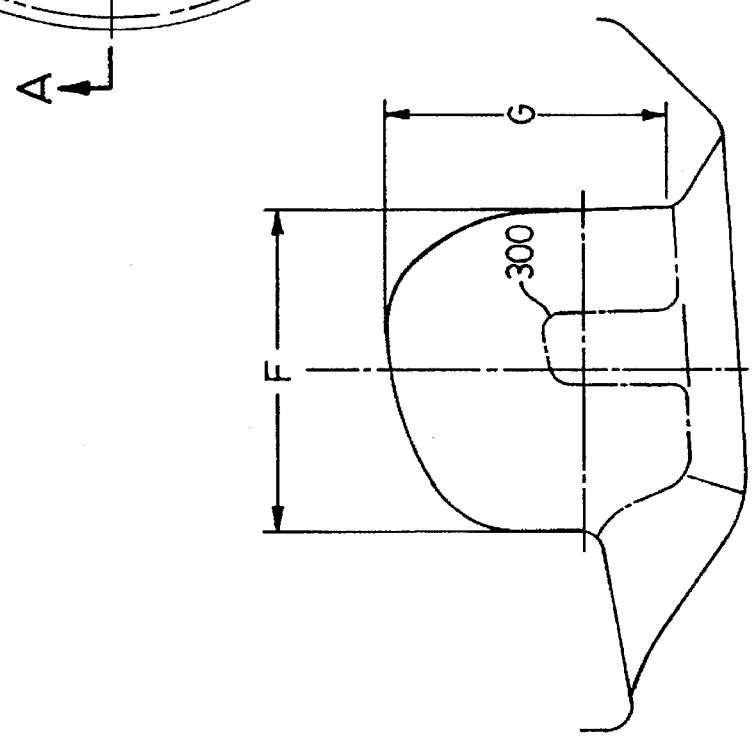
FIG. 21 shows a view taken along line A—A of FIG. 20.

FIGS. 20 and 21 show a helmet in accordance with the present invention. In the Figures, dimension F indicates the helmet front to back depth, dimension G indicates the helmet height and dimension H indicates the helmet width. To better ensure the fit of the helmet, ear channels 300 are also provided to accommodate ears while providing a closer fit about the rest of the skull. One preferred shape has been found to be an F dimension of about 230 mm, a G dimension of about 220 mm and an H dimension of about 190 mm.

The present inventors have constructed a helmet based on anthropometric information by provided by Dr. D. Racansky of the University of Toronto Institute of Biomedical Engineering for use on occidentals and has an F dimension of about 213 mm, a G dimension of about 186 mm and an H dimension of about 161 mm.

From information provided by the Japanese military, the present inventors have also constructed a helmet 216 for use on orientals. This helmet has an F dimension of about 203 mm, a G dimension of about 178 mm and an H dimension of about 172 mm. Of course, other sizes and/or modified shapes will also occur to those of skill in the art and are not intended to be excluded from these discussions.

In the presently preferred embodiment of the invention, helmet 216 is tilted at an angle of 15 degrees with respect to the axis of dewar 204. Specifically, helmet 216 is tilted raising the front portion of the helmet and lowering the back portion and this results in an improved 'fit' between the helmet and the subject's head.

In view of the above, it will be apparent to those of skill in the art that the present invention provides a novel method and system for obtaining higher order gradiometer measurements with lower order gradiometers. This is accomplished by appropriately combining measurements obtained from sensor gradiometers of a given order with measurements obtained from a reference system which includes a tensor gradiometer for each order from the sensor order to one order less than the desired order. The present invention allows the desired order to be changed, either on real time, on-line data or on stored, off-line data.

TABLE A $$^uB = {}^oB + {}^oG^{(1)} \cdot u + \frac{1}{2} \cdot {}^oG^{(2)} \cdot u \cdot u + \ldots \quad (1)$$

$$^uG^{(1)} = {}^oG^{(1)} + {}^oG^{(2)} \cdot u + \ldots \quad (2)$$

$$^uG^{(2)} = {}^oG^{(2)} + {}^oG^{(3)} \cdot u + \ldots \quad (3)$$

$$^uG^{(3)} = {}^oG^{(3)} + {}^oG^{(4)} \cdot u + \ldots \quad (4)$$

$$s^{(0)} = \alpha_B \cdot (p \cdot B) \quad (5)$$

$$s^{(1)} = \alpha_G \cdot (p \cdot {}^{u1}B - p \cdot {}^{u2}B) \quad (6)$$

$$s^{(1)} = \alpha_G \cdot p \cdot G^{(1)} \cdot d \quad (7)$$

$$s^{(2)} = \alpha_{G2} \cdot (p \cdot {}^uG^{(1)} \cdot d - p \cdot {}^wG^{(1)} \cdot d) \quad (8)$$

$$s^{(2)} = \alpha_{G2} \cdot p \cdot G^{(2)} \cdot q \cdot d \quad (9)$$

$$s^{(1)} = s^{(0)} - \frac{\alpha_s}{\alpha_B} \cdot (p \cdot b) \quad (10)$$

$$s^{(1)} = s^{(0)} - c_1 \cdot b_1 - c_2 \cdot b_2 - c_3 \cdot b_3 \quad (11)$$

$$s^{(2)} = s^{(0)} - \frac{\alpha_s}{\alpha_B} \cdot (p \cdot b) - \frac{\alpha_s}{\alpha_{G1}} \cdot \frac{1}{d_{G1}} \cdot p \cdot g \cdot d \quad (12)$$

$$g = \begin{pmatrix} g_{11} & g_{12} & g_{13} \\ g_{12} & g_{22} & g_{23} \\ g_{13} & g_{23} & -g_{11} - g_{22} \end{pmatrix} \quad (13)$$

$$s^{(2)} = s^{(0)} - \sum_{j=1}^{9} c_j \cdot b_j - \sum_{j=1}^{5} k_j \cdot y_j \quad (14)$$

$$k_1 = \frac{\alpha_s}{\alpha_{G_{11}}} \cdot \frac{1}{d_{11}} \cdot (p_1 \cdot d_1 - p_3 \cdot d_3) \quad (15)$$

$$k_2 = \frac{\alpha_s}{\alpha_{G_{12}}} \cdot \frac{1}{d_{12}} \cdot (p_1 \cdot d_2 + p_2 \cdot d_1) \quad (16)$$

$$k_3 = \frac{\alpha_s}{\alpha_{G_{13}}} \cdot \frac{1}{d_{13}} \cdot (p_1 \cdot d_3 + p_3 \cdot d_1) \quad (17)$$

$$k_4 = \frac{\alpha_s}{\alpha_{G_{22}}} \cdot \frac{1}{d_{22}} \cdot (p_2 \cdot d_2 - p_3 \cdot d_3) \quad (18)$$

$$k_5 = \frac{\alpha_s}{\alpha_{G_{23}}} \cdot \frac{1}{d_{23}} \cdot (p_2 \cdot d_3 + p_3 \cdot d_2) \quad (19)$$

$$s^{(2)} = s^{(1)} - \sum_{j=1}^{5} k_j \cdot y_j \quad (20)$$

$$s^{(3)} = s^{(0)} - \frac{\alpha_s}{\alpha_B} \cdot (p \cdot b) - \frac{\alpha_s}{\alpha_{G1}} \cdot \frac{1}{d_{G_1}} \cdot p \cdot g^{(1)} \cdot d - \quad (21)$$

$$\frac{\alpha_s}{\alpha_{G2}} \cdot \frac{1}{d_{G1}} \cdot \frac{1}{q_{G2}} \cdot p \cdot g^{(2)} \cdot q \cdot d$$

TABLE A-continued $$s^{(3)} = s^{(0)} - \sum_{j=1}^{3} c_j \cdot b_j - \sum_{j=1}^{5} k_j \cdot y_1 - \sum_{j=1}^{7} h_j \cdot g_j \quad (22)$$

$$s^{(3)} = s^{(0)} - \sum_{j=1}^{3} c_j \cdot b_j - \sum_{j=1}^{5} k_j \cdot g_j^{(1)} - \sum_{j=1}^{2} M_j \cdot x_j - \quad (23)$$

$$\sum_{j=1}^{5} D_j \cdot y_j - \sum_{j=1}^{5} N_j \cdot z_j + \sum_{j=1}^{2} T_j \cdot v_j$$

$$s^{(3)} = s^{(1)} - \sum_{j=1}^{5} k_j \cdot g_j^{(1)} - \sum_{j=1}^{2} M_j \cdot x_j - \sum_{j=1}^{5} D_j \cdot y_j - \quad (24)$$

$$\sum_{j=1}^{5} N_j \cdot z_j + \sum_{j=1}^{2} T_j \cdot v_j$$

$$s^{(3)} = s^{(2)} - \sum_{j=1}^{2} M_j \cdot x_j - \sum_{j=1}^{5} D_j \cdot y_j - \sum_{j=1}^{5} N_j \cdot z_j + \sum_{j=1}^{2} T_j \cdot v_j \quad (25)$$

What is claimed is:

1. A method of obtaining a magnetic measurement substantially equivalent to that which would be obtained from a gradiometer of a selected order equal to second order or greater which is higher than an existing order of a sensor gradiometer, comprising the steps of:
   (i) locating said sensor gradiometer at a first position;
   (ii) locating a reference system spaced from said first position, said reference system comprising at least one tensor gradiometer of the existing order and as required for each of an order higher up to one order less than said selected order such that a tensor for each of said orders may be determined from said reference system;
   (iii) determining said tensor for each of said orders of said reference system;
   (iv) determining a set of characteristic vectors of said sensor gradiometer relative to said reference system;
   (v) measuring the output from said sensor gradiometer;
   (vi) projecting each said determined tensor of said reference system to said set of characteristic vectors of said sensor gradiometer and combining the result of said projection with said measured output to form a measurement substantially equivalent to that which would be obtained from a sensor of said selected order.

2. The method of claim 1 repeating steps (iii) through (vi) for each of a plurality of sensor gradiometers of said existing order.

3. The method according to claim 2 wherein the steps I) through vi) are performed when said existing order is zero order.

4. The method according to claim 2 wherein the steps I) through vi) are performed when said existing order is first order.

5. The method according to claim 2 wherein the steps I) through vi) are performed when said existing order is second order or higher and said selected order is at least one order higher than said existing order.

6. The method of claim 2 wherein step (iii) is accomplished by determining a set of linearly independent components of each said tensor of said reference system and wherein step (vi) is accomplished by projecting the set of linearly independent components of each of said determined tensor of said reference system to said set of characteristic vectors of each of said plurality of sensor gradiometers and combining the results of said projection with said measured outputs by linear operations.

7. The method of claim 6 wherein step vi) is accomplished when each said set of linearly independent components of each said determined tensor is a minimum set of said components.

8. A system for obtaining magnetic measurements substantially equivalent to that which would be obtained from a gradiometer of a selected order equal to second order or greater which is higher than an existing order of a sensor gradiometer, comprising:
   (i) at least one sensor gradiometer of an existing order producing a measured output;
   (ii) a reference system spaced from said at least one sensor gradiometer, said reference system comprising at least one tensor gradiometer of the existing order and as required for each of an order higher up to one order less than said selected order such that a tensor for each of said orders may be determined from said reference system;
   (iii) a signal processing means for determining a set of characteristic vectors of said at least one sensor gradiometer relative to said reference system;
   said signal processing means projecting an output from each of said tensor gradiometers of said reference system to said set of characteristic vectors of said at least one sensor gradiometer and to combine the result of said projection with said measured output to form a measurement substantially equivalent to that which would be obtained from a sensor of said selected order.

9. A system according to claim 8 comprising a plurality of sensor gradiometers.

10. A system according to claim 9 wherein said existing order of said plurality of sensor gradiometers is zero order.

11. A system according to claim 9 wherein said existing order of said plurality of sensor gradiometers is first order.

12. A system according to claim 9 wherein said existing order of said plurality of sensor gradiometers is second order and said selected order is at least third order.

13. A biomagnetometer system for obtaining biomagnetic measurements substantially equivalent to those which would be obtained from sensor gradiometers of a selected order equal to second order or greater, said selected order being higher than an existing order of the sensor gradiometers employed, comprising:

a plurality of sensor gradiometers of an existing order;
   a reference system spaced from said plurality of sensor gradiometers comprising a tensor gradiometer of the existing order and as required for each of an order higher up to one order less than said selected order such that a tensor for each of said orders may be determined from said reference system;
   means to acquire signals from said plurality of sensor gradiometers and from said tensor gradiometers;
   means to digitize said signals;
   processing means for determining a set of characteristic vectors for each of said plurality of sensor gradiometers and to project said digitized signals from said tensor gradiometers to each set of characteristic vectors for each of said plurality of sensor gradiometers and to combine each result of said projection with said digitized signal obtained from each respective sensor gradiometer to form measurements substantially equivalent to that which would be obtained from sensor gradiometers of said selected order.

14. A biomagnetometer system according to claim 13 further comprising a helmet about which said plurality of sensor gradiometers are arrayed, said helmet being shaped to receive a human head.

15. A biomagnetometer system according to claim 14 wherein said helmet encloses a volume defined by measurements including a front to back depth of about 230 mm, a height of about 220 mm and a width of about 190 mm.

16. A biomagnetometer system according to claim 14 wherein said helmet is formed as one end of a dewar which encloses said plurality of sensor gradiometers and said reference system, said dewar containing a cryogen when in use.

17. A biomagnetometer system according to claim 16 wherein said dewar is supported by a gantry.

18. A biomagnetometer system according to claim 13 wherein said processing means comprises a plurality of signal processing devices, each of said plurality of signal processing devices processing signals from one or more than one of said sensor gradiometers.

19. A biomagnetometer system according to claim 13 further comprising EEG input means for simultaneously collecting EEG measurements with signals acquired from said plurality of sensor gradiometers and from said tensor gradiometers.

20. A biomagnetometer system according to claim 13 wherein said digitized measurement signals are stored in said processing means for processing off-line.

21. A biomagnetometer system according to claim 20 wherein said selected order is selected after said digitized measurement signals are stored.

22. A method of obtaining magnetic measurements with at least one sensor gradiometer of an existing order, said measurements being substantially equivalent to magnetic measurements which would be obtained with a like number of gradiometers of a selected higher order equal to second order or higher, comprising the steps of:

(i) locating a reference system at a first location, said reference system measuring a tensor for each of an order equal to said existing order and of each order, if any, greater than said existing order and less than said selected order;

(ii) locating said at least one sensor gradiometer at a respective second location and determining characterizing vectors for said at least one sensor gradiometer;

(iii) obtaining an output representing a magnetic measurement from said at least one sensor gradiometer;

(iv) projecting said measured tensors to said second location and combining the result of said projection with said obtained output to form a magnetic measurement substantially equivalent to that which would have been determined with a like number of sensor gradiometers of said selected order.

* * * * *